(12) United States Patent
Hori

(10) Patent No.: US 11,951,870 B2
(45) Date of Patent: Apr. 9, 2024

(54) BATTERY MONITORING APPARATUS

(71) Applicant: DENSO CORPORATION, Kariya (JP)

(72) Inventor: Fumihiko Hori, Kariya (JP)

(73) Assignee: DENSO CORPORATION, Kariya (JP)

( * ) Notice: Subject to any disclaimer, the term of this patent is extended or adjusted under 35 U.S.C. 154(b) by 350 days.

(21) Appl. No.: 17/394,938

(22) Filed: Aug. 5, 2021

(65) Prior Publication Data

US 2021/0362623 A1 Nov. 25, 2021

Related U.S. Application Data

(63) Continuation of application No. PCT/JP2020/002781, filed on Jan. 27, 2020.

(30) Foreign Application Priority Data

Feb. 5, 2019 (JP) .................................. 2019-019217

(51) Int. Cl.
*B60L 58/18* (2019.01)
*B60L 3/12* (2006.01)
(Continued)

(52) U.S. Cl.
CPC ................. *B60L 58/18* (2019.02); *B60L 3/12* (2013.01); *G01R 31/382* (2019.01);
(Continued)

(58) Field of Classification Search
CPC ......... B60L 58/18; B60L 3/12; G01R 31/396; G01R 31/382; H01M 10/48; H01M 10/482; H02J 7/00; H02J 7/0013
See application file for complete search history.

(56) References Cited

U.S. PATENT DOCUMENTS

2014/0312913 A1 10/2014 Kikuchi et al.
2014/0354291 A1 12/2014 Kikuchi et al.

FOREIGN PATENT DOCUMENTS

| JP | 2008-193871 A | 8/2008 |
| JP | 2010-146991 A | 7/2010 |
| JP | 5168176 B2 | 3/2013 |

OTHER PUBLICATIONS

Feb. 25, 2020 Search Report issued in International Patent Application No. PCT/JP2020/002781.

*Primary Examiner* — Robert L Deberadinis
(74) *Attorney, Agent, or Firm* — Oliff PLC

(57) ABSTRACT

A battery monitoring apparatus is provided for monitoring unit batteries of an assembled battery which are grouped into battery blocks. The battery monitoring apparatus includes a battery ECU, voltage monitors each being mounted to a corresponding one of the battery blocks, and a monitor activation device. The battery ECU is configured to wirelessly transmit commands to the voltage monitors. The voltage monitors are configured to detect voltage information of the unit batteries and wirelessly transmit the detected voltage information to the battery ECU. The monitor activation device is configured to sequentially activate the voltage monitors with time lags in a predetermined order recognized by the battery ECU. Moreover, the battery monitoring apparatus is configured so that: the voltage monitors sequentially start wireless communication with the battery ECU in the predetermined order; and the battery ECU assigns IDs, via the wireless communication, sequentially to the voltage monitors in the predetermined order.

16 Claims, 6 Drawing Sheets

(51) Int. Cl.
*G01R 31/382* (2019.01)
*G01R 31/396* (2019.01)
*H01M 10/48* (2006.01)
*H02J 7/00* (2006.01)

(52) U.S. Cl.
CPC .......... *G01R 31/396* (2019.01); *H01M 10/48* (2013.01); *H01M 10/482* (2013.01); *H02J 7/0013* (2013.01)

BATTERY MONITORING APPARATUS

CROSS-REFERENCE TO RELATED APPLICATIONS

The present application is a continuation application of International Application No. PCT/JP2020/002781 filed on Jan. 27, 2020, which is based on and claims priority from Japanese Patent Application No. 2019-019217 filed on Feb. 5, 2019. The entire contents of these applications are incorporated by reference into the present application.

BACKGROUND

1 Technical Field

The present disclosure relates to a battery monitoring apparatus that monitors a plurality of unit batteries of an assembled battery installed in a vehicle.

2 Description of Related Art

There is disclosed, for example in Japanese Patent No. JP 5168176 B2, a battery monitoring apparatus for monitoring a plurality of unit batteries of an assembled battery installed in a vehicle. The unit batteries of the assembled battery are grouped into a plurality of battery blocks. The battery monitoring apparatus includes a battery ECU and a plurality of voltage monitors connected with the battery ECU via communication lines. The battery ECU is configured to send commands to the voltage monitors via the communication lines. Each of the voltage monitors is mounted to a corresponding one of the battery blocks. Moreover, each of the voltage monitors is configured to detect voltage information of the unit batteries of the corresponding battery block and send the detected voltage information to the battery ECU via the communication lines.

SUMMARY

According to the present disclosure, there is provided a battery monitoring apparatus for monitoring a plurality of unit batteries of an assembled battery installed in a vehicle. The unit batteries of the assembled battery are grouped into a plurality of battery blocks. The battery monitoring apparatus includes a battery ECU, a plurality of voltage monitors each of which is adapted to be mounted to a corresponding one of the battery blocks, and a monitor activation device. The battery ECU is configured to wirelessly transmit commands to the voltage monitors. The voltage monitors are configured to detect voltage information of the unit batteries and wirelessly transmit the detected voltage information to the battery ECU. The monitor activation device is configured to sequentially activate the voltage monitors with time lags therebetween in a predetermined order recognized by the battery ECU. Moreover, the battery monitoring apparatus is configured so that: the voltage monitors sequentially start wireless communication with the battery ECU in the predetermined order in which the voltage monitors are sequentially activated by the monitor activation device; and the battery ECU assigns IDs, via the wireless communication, sequentially to the voltage monitors in the predetermined order.

DESCRIPTION OF EMBODIMENTS

Figure 1:
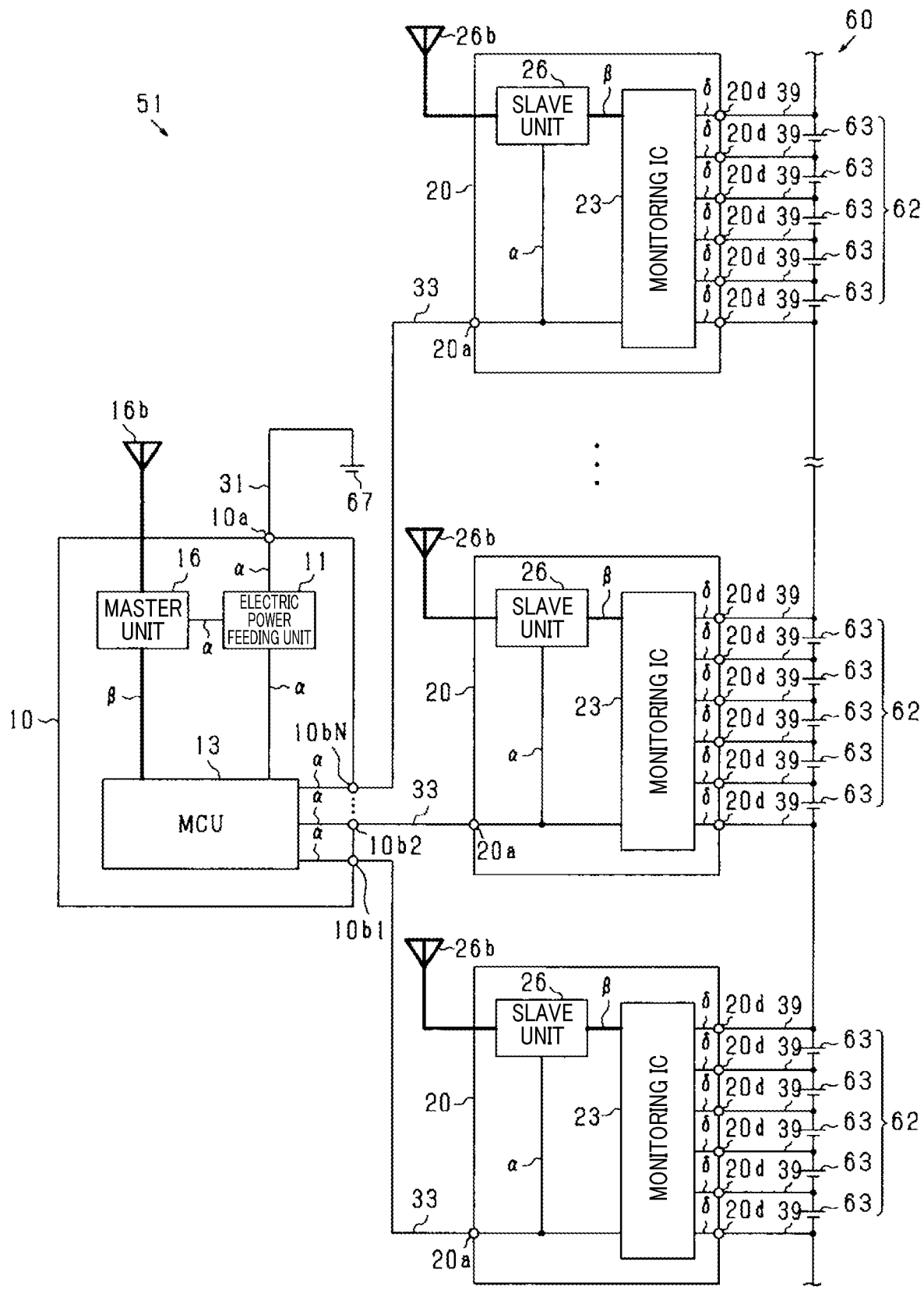
FIG. 1 is a schematic circuit diagram illustrating the configuration of a battery monitoring apparatus according to a first embodiment.

In recent years, there has been a tendency for the amount of electric power used in vehicles to increase. Accordingly, there has also been a tendency for the number of unit batteries included in each of assembled batteries used in vehicles to increase; thus there has also been a tendency for the number of battery blocks, into which the unit batteries are grouped, and the number of voltage monitors respectively corresponding to the battery blocks to increase. Consequently, the number of the communication lines connecting the battery ECU and the voltage monitors is increased. As a countermeasure, it has been proposed to perform wireless communication between the battery ECU and the voltage monitors.

Moreover, in performing communication between the battery ECU and the voltage monitors, it is necessary for the battery ECU to identify, for each of the detected values of voltages sent from the voltage monitors, which one of the battery blocks corresponds to the detected value. Accordingly, it is necessary to assign IDs to the voltage monitors in a predetermined order, for example, in the order in which the electric potentials of the battery blocks respectively corresponding to the voltage monitors increase or in the order in which the electric potentials of the battery blocks respectively corresponding to the voltage monitors decrease.

In a wired battery monitoring apparatus, it is possible to employ, for example, a cascade connection in which: all the voltage monitors are connected in series with each other in the predetermined order via communication lines; and the two voltage monitors respectively at opposite ends of the series connection are further connected with the battery ECU via communication lines. In this case, it is possible to assign IDs to the voltage monitors in the predetermined order by assigning IDs in the order of communication.

However, in a wireless battery monitoring apparatus, it is impossible to employ the above-described cascade connection. Therefore, it is necessary to use a different method for assigning IDs to the voltage monitors in the predetermined order.

The present disclosure has been accomplished in view of the above circumstances. With the configuration of the above-described battery monitoring apparatus according to the present disclosure, it is possible for the battery ECU to assign IDs, via the wireless communication between the battery ECU and the voltage monitors, sequentially to the voltage monitors in the predetermined order that is recognized by the battery ECU.

Exemplary embodiments will be described hereinafter with reference to the drawings. It should be noted that for the sake of clarity and understanding, identical components having identical functions throughout the whole description have been marked, where possible, with the same reference numerals in the drawings and that for the sake of avoiding redundancy, descriptions of identical components will not be repeated.

First Embodiment

FIG. 1 illustrates the configuration of a battery monitoring apparatus 51 according to the first embodiment. The battery monitoring apparatus 51 is configured to be used in a vehicle to monitor an assembled battery 60 installed in the vehicle. In addition to the battery monitoring apparatus 51 and the assembled battery 60, there are also installed a drive power apparatus, an auxiliary battery 67 and the like in the vehicle.

The assembled battery 60 has a plurality of unit batteries 63 connected in series with each other. In the present embodiment, the unit batteries 63 of the assembled battery 60 are grouped into a plurality of battery blocks 62.

The battery monitoring apparatus 51 includes a battery ECU 10 and a plurality of voltage monitors 20. Moreover, the battery monitoring apparatus 51 is also provided with an electric power supply line 31, a plurality of electric power lines 33 and a plurality of detection lines 39.

The battery ECU 10 includes an electric power feeding unit 11, an MCU 13 and a master unit 16. Moreover, the battery ECU 10 is also provided with an electric power supply port 10a, a plurality of electric power output ports 10b1-10bN, electrical wiring α and communication wiring β. In addition, the master unit 16 includes an antenna 16b.

Each of the voltage monitors 20 includes a monitoring IC 23 and a slave unit 26. Moreover, each of the voltage monitors 20 is also provided with an electric power input port 20a, a plurality of detection ports 20d, electrical wiring α, communication wiring β and detection wiring δ. In addition, the slave unit 26 includes an antenna 26b.

In the present embodiment, the master unit 16 of the battery ECU 10 and the slave units 26 of the voltage monitors 20 together constitute a wireless communication device.

Next, the configuration of the battery monitoring apparatus 51 according to the present embodiment will be described in detail.

The drive power apparatus of the vehicle may be an internal combustion engine, an electric motor or a hybrid power apparatus consisting of an internal combustion engine and an electric motor.

Each of the unit batteries 63 of the assembled battery 60 may be a single battery cell or a collection of battery cells connected in series with each other. In the present embodiment, each battery cell is implemented by a lithium cell. However, it should be noted that each battery cell may be implemented by any other cell.

Each of the voltage monitors 20 is mounted to a corresponding one of the battery blocks 62.

The auxiliary battery 67 is connected, via the electric power supply line 31, with the electric power supply port 10a of the battery ECU 10. The electric power feeding unit 11 is connected, via the electrical wiring α, with the electric power supply port 10a, the MCU 13 and the master unit 16.

The electric power feeding unit 11 includes an electric power feeding switch (not shown). When a power switch (i.e., a start switch of the drive power apparatus) of the vehicle is turned on, the electric power feeding switch of the electric power feeding unit 11 is also turned on in conjunction with the power switch. Moreover, when the power switch of the vehicle is turned off, the electric power feeding switch of the electric power feeding unit 11 is also turned off in conjunction with the power switch. Furthermore, when the electric power feeding switch is in an off-state, electric power is fed by the electric power feeding unit 11 neither to the MCU 13 nor to the master unit 16. On the other hand, upon the electric power feeding switch being turned on, electric power supplied from the auxiliary battery 67 is fed by the electric power feeding unit 11 to both the MCU 13 and the master unit 16; consequently, the battery ECU 10 is activated.

The MCU 13 issues commands to the monitoring ICs 23 of the voltage monitors 20. The commands include a command to acquire voltage information of the unit batteries 63 and a command to discharge the unit batteries 63.

More specifically, the MCU 13 and the master unit 16 are communicably connected with each other via the communication wiring β. The MCU 13 sends the commands and the like to the master unit 16 via the communication wiring β. On the other hand, the master unit 16 sends the voltage information and the like, which are wirelessly received from the slave units 26 of the voltage monitors 20, to the MCU 13 via the communication wiring β.

In the present embodiment, the battery ECU 10 (more specifically, the MCU 13 of the battery ECU 10) constitutes a monitor activation device that sequentially activates the voltage monitors 20 with time lags therebetween (i.e., respectively at different times). The MCU 13 is connected, via the electrical wiring α, with each of the electric power output ports 10b1-10bN.

The electric power output ports 10b1-10bN of the battery ECU 10 are respectively connected with the electric power input ports 20a of the voltage monitors 20 via the electric power lines 33. Specifically, the first electric power output port 10b1 is connected with the electric power input port 20a of the voltage monitor 20 corresponding to the battery block 62 having the lowest electric potential. Moreover, the second electric power output port 10b2 is connected with the electric power input port 20a of the voltage monitor 20 corresponding to the battery block 62 having the second lowest electric potential. In this manner, the electric power output ports 10b1-10bN of the battery ECU 10 are sequentially connected with the corresponding electric power input ports 20a of the voltage monitors 20 in the order in which the electric potentials of the battery blocks 62 respectively corresponding to the voltage monitors 20 increase. Furthermore, the MCU 13 sequentially starts, in the order in which the electric potentials of the battery blocks 62 respectively corresponding to the voltage monitors 20 increase, electric power supply to the voltage monitors 20 via the electric power output ports 10b1-10bN of the battery ECU 10, the electric power lines 33 and the electric power input ports 20a of the voltage monitors 20. Consequently, the voltage monitors 20 are sequentially activated in the order in which the electric potentials of the battery blocks 62 respectively corresponding to the voltage monitors 20 increase. Moreover, the master unit 16 of the battery ECU 10 recognizes the voltage monitors 20 as being sequentially activated in the order in which the electric potentials of the battery blocks 62 respectively corresponding to the voltage monitors 20 increase.

In each of the voltage monitors 20, the electric power input port 20a is connected, via the electrical wiring α, with both the monitoring IC 23 and the slave unit 26. Therefore, upon supply of electric power to the electric power input port 20a, electric power is further supplied to both the monitoring IC 23 and the slave unit 26, thereby activating the voltage monitor 20.

Moreover, in each of the voltage monitors 20, the monitoring IC 23 includes a multiplexer. The multiplexer is connected, via the detection wiring δ, with each of the detection ports 20d. Further, two of the detection ports 20d are respectively connected with opposite ends of the corresponding battery block 62 via the corresponding detection lines 39; the remaining detection ports 20d are respectively connected with junction points between terminals of the unit batteries 63 of the corresponding battery block 62 via the corresponding detection lines 39. The multiplexer is configured to sequentially detect the voltage information between the terminals of each of the unit batteries 63. The voltage information may be the actual voltage between the terminals of each of the unit batteries 63; alternatively, it may be information on other parameters from which the actual voltage can be derived, such as electric current flowing through a predetermined part. Moreover, the multiplexer is further configured to discharge any of the unit batteries 63 as needed. Consequently, it is possible to perform a balancing process for equalizing the SOCs (or states of charges) of the unit batteries 63.

Furthermore, in each of the voltage monitors 20, the monitoring IC 23 and the slave unit 26 are communicably connected with each other via the communication wiring β. The slave unit 26 sends the commands and the like, which are wirelessly received from the master unit 16 of the battery ECU 10, to the monitoring IC 23 via the communication wiring β. On the other hand, the monitoring IC 23 sends the voltage information and the like to the slave unit 26 via the communication wiring β.

Upon establishment of a wireless communication link between the master unit 16 of the battery ECU 10 and each of the slave units 26 of the voltage monitors 20, the commands issued by the MCU 13 of the battery ECU 10 are wirelessly transmitted by the master unit 16 to the slave units 26; the voltage information is wirelessly transmitted by the slave units 26 to the master unit 16.

Figure 2:
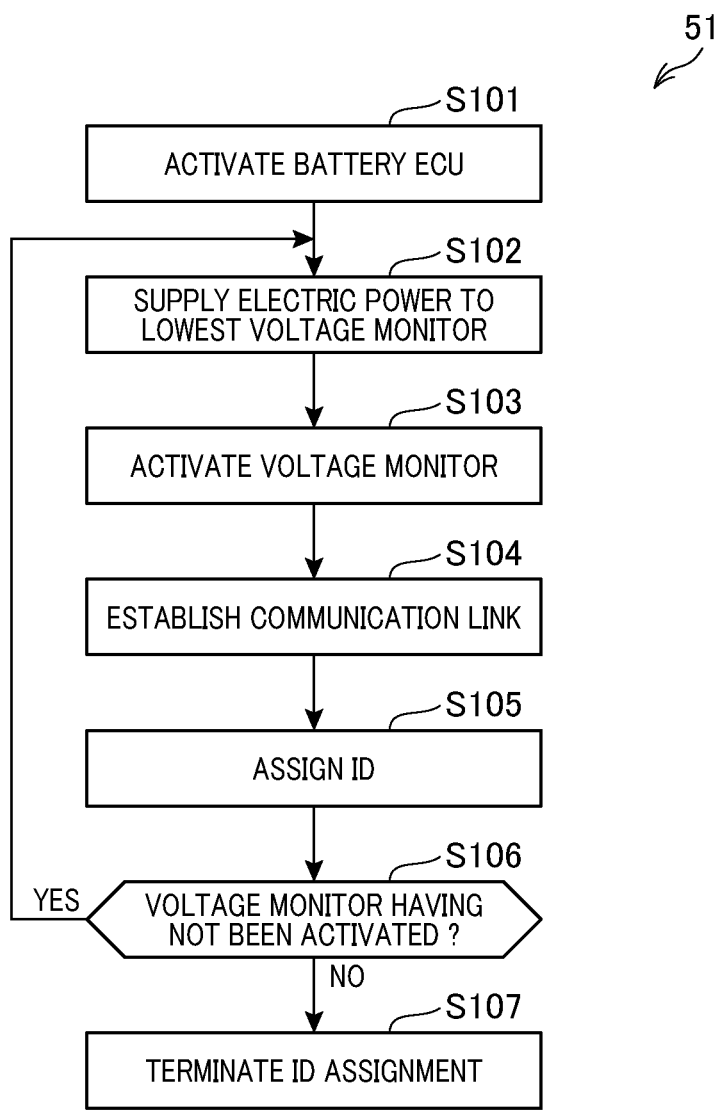
FIG. 2 is a flow chart illustrating a process of assigning IDs to voltage monitors in the battery monitoring apparatus according to the first embodiment.

Next, with reference to FIG. 2, explanation will be given of a process of assigning IDs to the voltage monitors 20 in the battery monitoring apparatus 51 according to the present embodiment.

In step S101, the battery ECU 10 is activated upon the power switch of the vehicle being turned on.

In step S102, the battery ECU 10 starts supplying electric power to, of the voltage monitors 20 having not been activated yet, the voltage monitor 20 corresponding to the battery block 62 having the lowest electric potential via the corresponding electric power line 33. Consequently, in step S103, the voltage monitor 20 is activated.

In step S104, the slave unit 26 of the voltage monitor 20 wirelessly communicates with the master unit 16 of the battery ECU 10 to establish a communication link therebetween.

In step S105, the master unit 16 assigns, of the IDs having not been assigned yet, the lowest ID to the slave unit 26 that has just established the communication link with the master unit 16.

In step S106, the MCU 13 of the battery ECU 10 determines whether there is at least one voltage monitor 20 having not been activated yet.

If the determination in step S106 results in a "YES" answer, i.e., if there is at least one voltage monitor 20 having not been activated yet, the process returns to step S102 to repeat steps S102-S106.

In contrast, if the determination in step S106 results in a "NO" answer, i.e., if all the voltage monitors 20 have been activated, the process proceeds to step S107.

In step S107, the process of assigning IDs to the voltage monitors 20 is terminated.

More particularly, in the present embodiment, the supply of electric power to the voltage monitor 20 corresponding to the battery block 62 having the lowest electric potential is started in step S102 by starting the supply of electric power to that one of the electric power output ports 10b1-10bN which is connected with the voltage monitor 20 via the corresponding electric power line 33. Moreover, the determination as to whether there is at least one voltage monitor 20 having not been activated yet is made in step S106 by determining whether there is, of the electric power output ports 10b1-10bN, at least one electric power output port having not been supplied with electric power yet.

As described above, in the ID assignment process according to the present embodiment, the slave unit 26 of the activated voltage monitor 20 wirelessly communicates with the master unit 16 of the battery ECU 10 to establish a communication link therebetween (steps S102-S104). Then, an ID is assigned to the slave unit 26 by the master unit 16 (step S105). Thereafter, the next voltage monitor 20 is supplied with electric power from the battery ECU 10 (step S102) and thereby activated (step S103).

According to the present embodiment, it is possible to achieve the following advantageous effects.

As described above, in the present embodiment, the battery monitoring apparatus 51 is configured to monitor the unit batteries 63 of the assembled battery 60 installed in a vehicle. The unit batteries 63 of the assembled battery 60 are grouped into the plurality of battery blocks 62. The battery monitoring apparatus 51 includes the battery ECU 10, the voltage monitors 20 and the monitor activation device that is constituted of the battery ECU 10 in the present embodiment. The battery ECU 10 is configured to wirelessly transmit commands to the voltage monitors 20. Each of the voltage monitors 20 is mounted to a corresponding one of the battery blocks 62. The voltage monitors 20 are configured to detect voltage information of the unit batteries 63 and wirelessly transmit the detected voltage information to the battery ECU 10. The monitor activation device (more particularly, the battery ECU 10 in the present embodiment) is configured to sequentially activate the voltage monitors 20 with time lags therebetween in a predetermined order recognized by the battery ECU 10. Moreover, the battery monitoring apparatus 51 is configured so that: the voltage monitors 20 sequentially start wireless communication with the battery ECU 10 in the predetermined order in which the voltage monitors 20 are sequentially activated by the monitor activation device; and the battery ECU 10 assigns IDs, via the wireless communication, sequentially to the voltage monitors 20 in the predetermined order.

With the above configuration, it becomes possible for the battery ECU 10 to assign IDs, via the wireless communication between the battery ECU 10 and the voltage monitors 20, sequentially to the voltage monitors 20 in the predetermined order that is recognized by the battery ECU 10.

Moreover, in the present embodiment, all the battery blocks 62 are connected in series with each other. The predetermined order, in which the voltage monitors 20 are sequentially activated, is the order in which the electric potentials of the battery blocks 62 respectively corresponding to the voltage monitors 20 increase. Consequently, it becomes possible for the battery ECU 10 to easily and reliably perform the assignment of IDs to the voltage monitors 20.

In the present embodiment, the monitor activation device is constituted of the battery ECU 10. Each of the voltage monitors 20 is connected with the battery ECU 10 via a corresponding one of the electric power lines 33. Each of the voltage monitors 20 is configured to be supplied with electric power from the battery ECU 10 via the corresponding electric power line 33 and thereby activated. The battery ECU 10 is configured to sequentially start the supply of electric power to the voltage monitors 20 in the predetermined order (more particularly, in the order in which the electric potentials of the battery blocks 62 respectively corresponding to the voltage monitors 20 increase in the present embodiment) and thereby sequentially activate the voltage monitors 20 in the predetermined order. Consequently, it becomes possible for the battery ECU 10 to easily and reliably perform the assignment of IDs to the voltage monitors 20 by sequentially supplying electric power to the voltage monitors 20.

Second Embodiment

A battery monitoring apparatus 52 according to the second embodiment has a similar configuration to the battery monitoring apparatus 51 according to the first embodiment. Therefore, the differences of the battery monitoring apparatus 52 from the battery monitoring apparatus 51 will be mainly described hereinafter.

Figure 3:
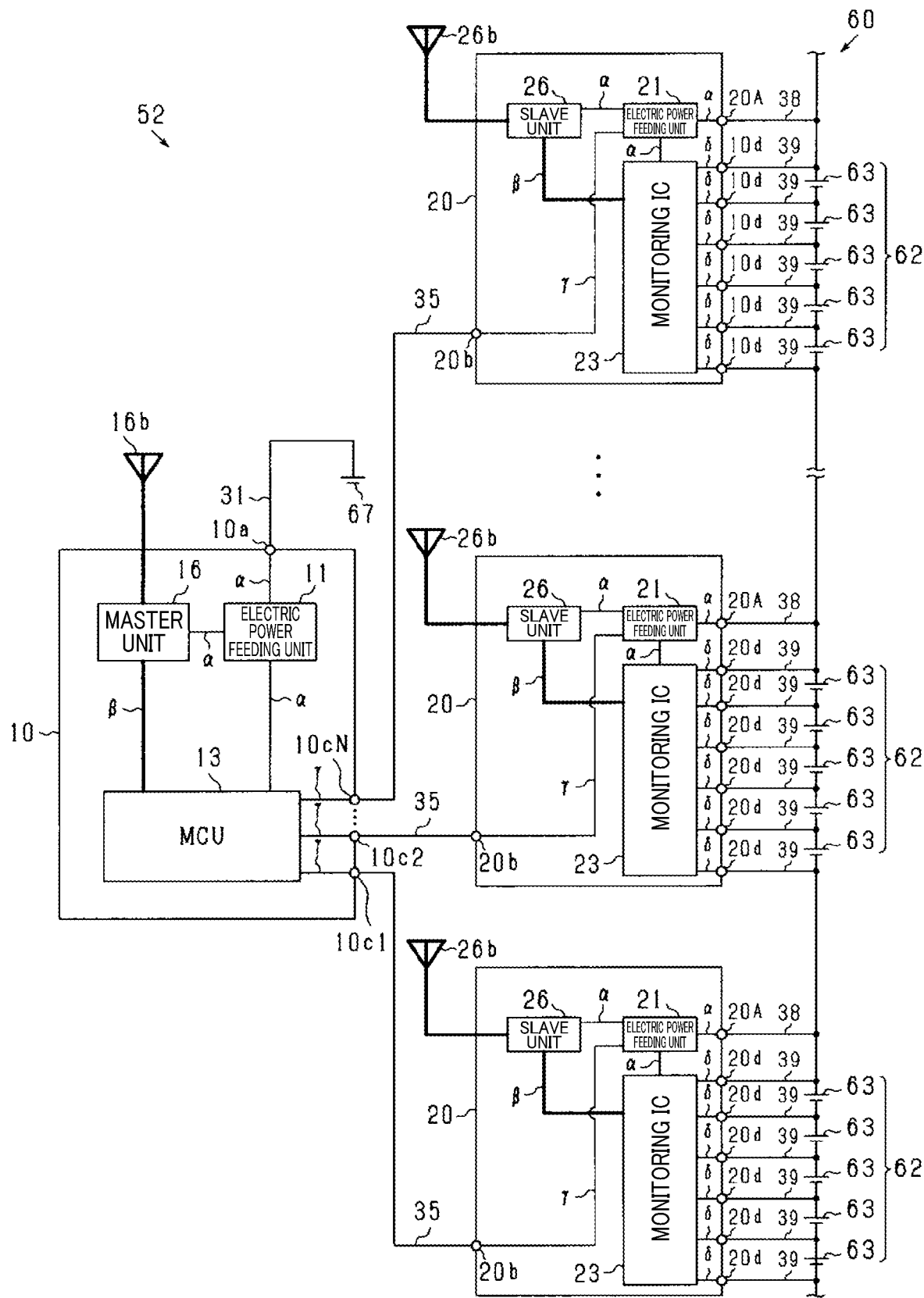
FIG. 3 is a schematic circuit diagram illustrating the configuration of a battery monitoring apparatus according to a second embodiment.

FIG. 3 illustrates the configuration of the battery monitoring apparatus 52 according to the second embodiment.

As shown in FIG. 3, in the present embodiment, the battery monitoring apparatus 52 includes a plurality of signal lines 35 and a plurality of electric power supply lines 38 instead of the electric power lines 33 described in the first embodiment.

Moreover, in the present embodiment, the battery ECU 10 is provided with a plurality of signal output ports $10c1$-$10cN$ instead of the electric power output ports $10b1$-$10bN$ described in the first embodiment. Further, in the present embodiment, the battery ECU 10 is provided with signal wiring γ instead of part of the electrical wiring α described in the first embodiment.

Furthermore, in the present embodiment, each of the voltage monitors 20 is provided with an electric power supply port 20A and a signal input port 20b instead of the electric power input port 20a described in the first embodiment. Further, the voltage monitor 20 is also provided with an electric power feeding unit 21.

Next, the configuration of the battery monitoring apparatus 52 according to the present embodiment will be described in detail.

The signal wiring γ and the signal lines 35 are formed of electrical conductor wires. The signal wiring γ and the signal lines 35 transmit an activation signal, but neither commands nor voltage values.

The MCU 13 is connected, via the signal wiring γ, with each of the signal output ports $10c1$-$10cN$.

The signal output ports $10c1$-$10cN$ of the battery ECU 10 are respectively connected with the signal input ports 20b of the voltage monitors 20 via the signal lines 35. Specifically, the first signal output port $10c1$ is connected with the signal input port 20b of the voltage monitor 20 corresponding to the battery block 62 having the lowest electric potential. Moreover, the second signal output port $10c2$ is connected with the signal input port 20b of the voltage monitor 20 corresponding to the battery block 62 having the second lowest electric potential. In this manner, the signal output ports $10c1$-$10cN$ of the battery ECU 10 are sequentially connected with the corresponding signal input ports 20b of the voltage monitors 20 in the order in which the electric potentials of the battery blocks 62 respectively corresponding to the voltage monitors 20 increase. Furthermore, via the signal output ports $10c1$-$10cN$ of the battery ECU 10, the signal lines 35 and the signal input ports 20b of the voltage monitors 20, the MCU 13 sends the activation signal sequentially to the voltage monitors 20 in the order in which the electric potentials of the battery blocks 62 respectively corresponding to the voltage monitors 20 increase.

In each of the voltage monitors 20, the electric power feeding unit 21 is connected, via the signal wiring γ, with the signal input port 20b. Moreover, the electric power feeding unit 21 is connected, via the electrical wiring α, with the electric power supply port 20A. Further, the electric power supply port 20A is connected, via a corresponding one of the electric power supply lines 38, with the assembled battery 60.

The electric power feeding unit 21 includes an electric power feeding switch (not shown). Without receipt of the activation signal, the electric power feeding switch is kept in an off-state. Upon receipt of the activation signal, the electric power feeding switch is turned on. When the electric power feeding switch is in the off-state, electric power is fed by the electric power feeding unit 21 neither to the monitoring IC 23 nor to the slave unit 26. On the other hand, upon the electric power feeding switch being turned on, electric power supplied from the unit batteries 63 is fed by the electric power feeding unit 21 to both the monitoring IC 23 and the slave unit 26; consequently, the voltage monitor 20 is activated. More specifically, the electric power feeding unit 21 is supplied with electric power from the unit batteries 63 of the battery block 62 corresponding to the voltage monitor 20 that includes the electric power feeding unit 21.

Figure 4:
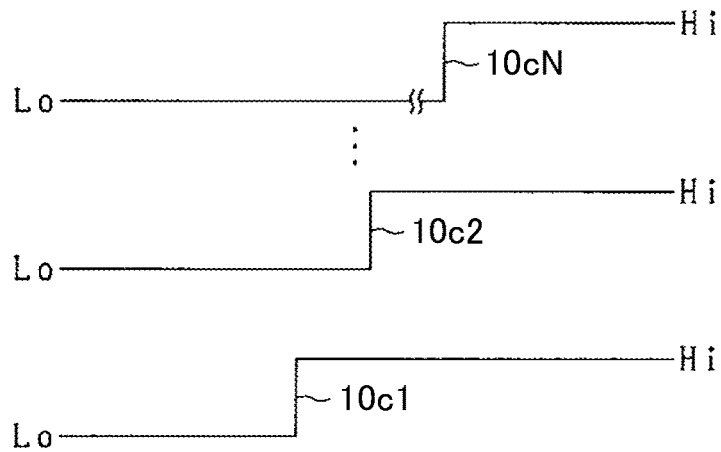
FIG. 4 is an explanatory diagram illustrating the output voltages of signal output ports of a battery ECU in the battery monitoring apparatus according to the second embodiment.

FIG. 4 illustrates the output voltages of the signal output ports $10c1$-$10cN$ of the battery ECU 10. As can be seen from FIG. 4, the output voltages of the signal output ports $10c1$-$10cN$ are changed from a lower voltage Lo to a higher voltage Hi sequentially with time lags therebetween (i.e., respectively at different times) from the lowest one, i.e., in the order of the first signal output port $10c1$, the second signal output port $10c2$, . . . , and the Nth signal output port $10cN$. The higher voltage Hi serves as the activation signal.

Figure 5:
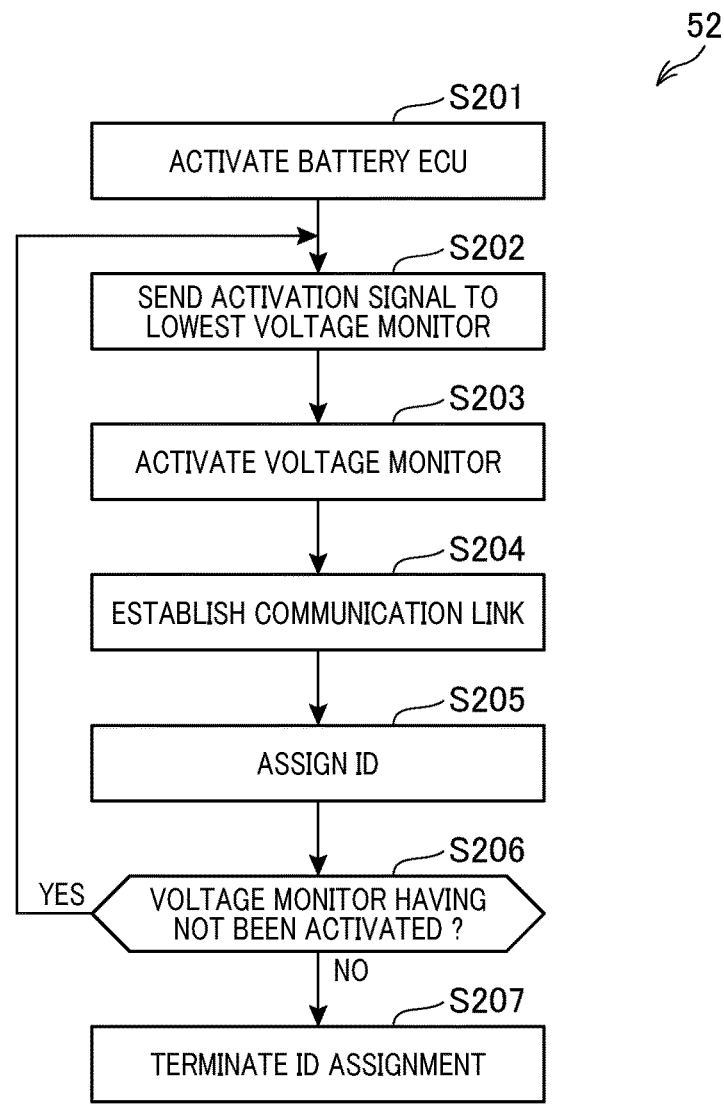
FIG. 5 is a flow chart illustrating a process of assigning IDs to voltage monitors in the battery monitoring apparatus according to the second embodiment.

Next, with reference to FIG. 5, explanation will be given of a process of assigning IDs to the voltage monitors 20 in the battery monitoring apparatus 52 according to the present embodiment.

In step S201, the battery ECU 10 is activated upon the power switch of the vehicle being turned on.

In step S202, the battery ECU 10 sends the activation signal to, of the voltage monitors 20 having not been activated yet, the voltage monitor 20 corresponding to the battery block 62 having the lowest electric potential via the corresponding signal line 35. Consequently, in step S203, the voltage monitor 20 is activated.

In step S204, the slave unit 26 of the voltage monitor 20 wirelessly communicates with the master unit 16 of the battery ECU 10 to establish a communication link therebetween.

In step S205, the master unit 16 assigns, of the IDs having not been assigned yet, the lowest ID to the slave unit 26 that has just established the communication link with the master unit 16.

In step S206, the MCU 13 of the battery ECU 10 determines whether there is at least one voltage monitor 20 having not been activated yet.

If the determination in step S206 results in a "YES" answer, i.e., if there is at least one voltage monitor 20 having not been activated yet, the process returns to step S202 to repeat steps S202-S206.

In contrast, if the determination in step S206 results in a "NO" answer, i.e., if all the voltage monitors 20 have been activated, the process proceeds to step S207.

In step S207, the process of assigning IDs to the voltage monitors 20 is terminated.

More particularly, in the present embodiment, the sending of the activation signal to the voltage monitor 20 corresponding to the battery block 62 having the lowest electric potential is performed in step S202 by changing the output voltage of that one of the signal output ports 10c1-10cN which is connected with the voltage monitor 20 via the corresponding signal line 35 from the lower voltage Lo to the higher voltage Hi. Moreover, the determination as to whether there is at least one voltage monitor 20 having not been activated yet is made in step S206 by determining whether there is, of the signal output ports 10c1-10cN, at least one signal output port whose output voltage is equal to the lower voltage Lo.

As described above, in the ID assignment process according to the present embodiment, the slave unit 26 of the activated voltage monitor 20 wirelessly communicates with the master unit 16 of the battery ECU 10 to establish a communication link therebetween (steps S202-S204). Then, an ID is assigned to the slave unit 26 by the master unit 16 (step S205). Thereafter, the activation signal is sent from the battery ECU 10 to the next voltage monitor 20 (step S202), thereby activating the next voltage monitor 20 (step S203).

According to the present embodiment, it is possible to achieve the same advantageous effects as described in the first embodiment.

That is, with the configuration of the battery monitoring apparatus 52 according to the present embodiment, it is also possible for the battery ECU 10 to assign IDs, via wireless communication between the battery ECU 10 and the voltage monitors 20, sequentially to the voltage monitors 20 in a predetermined order recognized by the battery ECU 10 (more particularly, in the order in which the electric potentials of the battery blocks 62 respectively corresponding to the voltage monitors 20 increase in the present embodiment).

Moreover, in the present embodiment, to sequentially activate the voltage monitors 20, the battery ECU 10 sends the activation signal sequentially to the voltage monitors 20 via the corresponding signal lines 35, instead of supplying electric power sequentially to the voltage monitors 20 via the corresponding electric power lines 33 as in the first embodiment. The signal lines 5 are allowed to be higher in electrical resistance than the electric power lines 33; therefore, the signal line 35 can be made thinner than the electric power lines 33. Moreover, the signal lines 35 transmit the activation signal (more particularly, the higher voltage Hi in the present embodiment), but neither commands nor voltage values; therefore, the signal lines 35 can be formed of simple electrical conductor wires. Consequently, it becomes possible to simplify the wiring between the battery ECU 10 and the voltage monitors 20 in comparison with the case of connecting the battery ECU 10 and the voltage monitors 20 via general communication lines.

Furthermore, in the present embodiment, since the battery ECU 10 does not supply electric power to the voltage monitors 20, it is unnecessary to provide in the battery ECU 10 any electric power supply circuit for supplying electric power to the voltage monitors 20. Consequently, it becomes possible to suppress the circuit scale of the battery ECU 10.

In addition, in the present embodiment, the voltage monitors 20 are supplied with electric power from the unit batteries 63 that are the monitoring targets of the voltage monitors 20. Consequently, it becomes possible to secure the required electric power for the voltage monitors 20 with a simple configuration.

Third Embodiment

A battery monitoring apparatus 53 according to the third embodiment has a similar configuration to the battery monitoring apparatus 52 according to the second embodiment. Therefore, the differences of the battery monitoring apparatus 53 from the battery monitoring apparatus 52 will be mainly described hereinafter.

Figure 6:
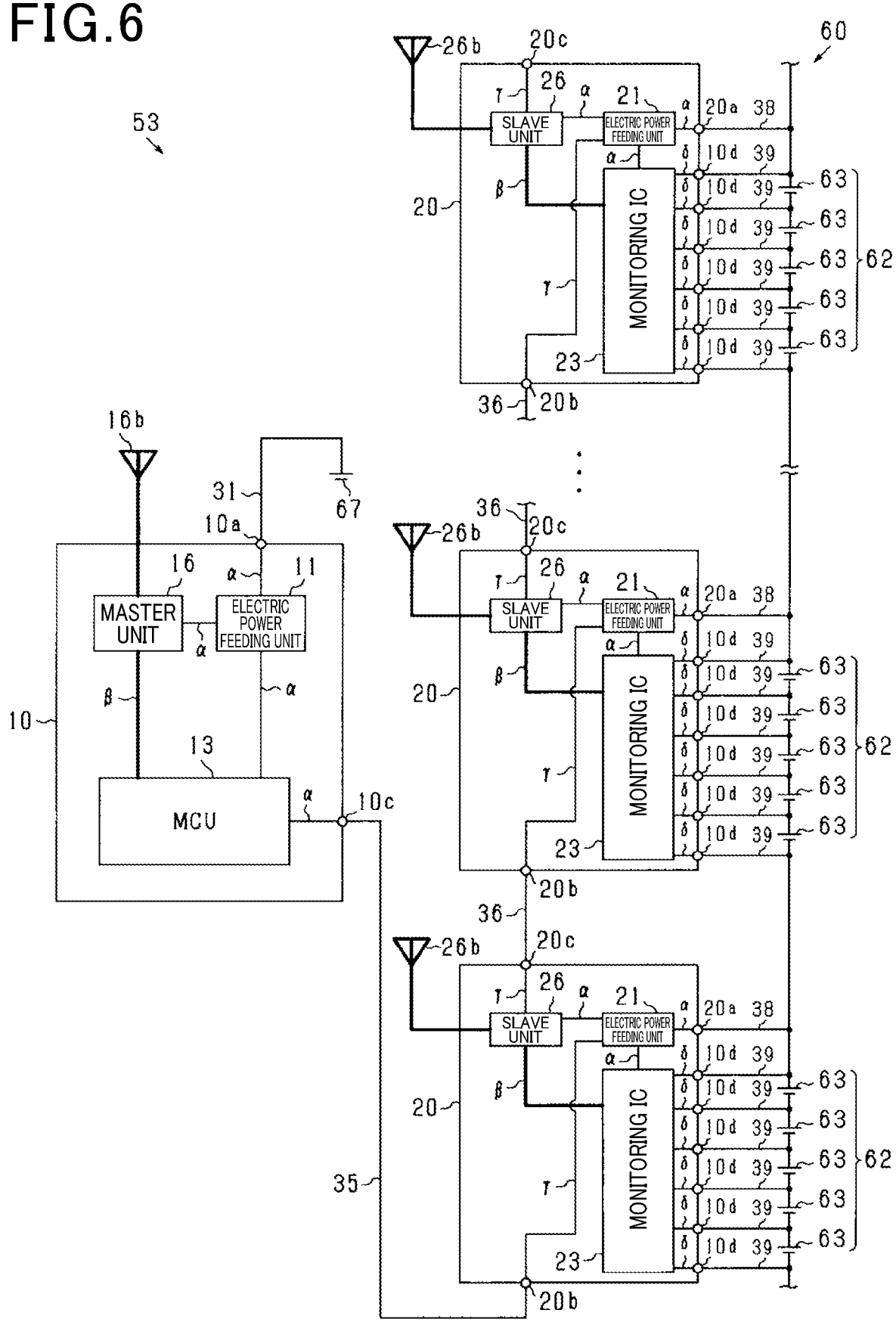
FIG. 6 is a schematic circuit diagram illustrating the configuration of a battery monitoring apparatus according to a third embodiment.

FIG. 6 illustrates the configuration of the battery monitoring apparatus 53 according to the third embodiment.

As shown in FIG. 6, in the present embodiment, the battery monitoring apparatus 53 includes a single signal line 35 and a plurality of connection lines 36 instead of the plurality of signal lines 35 described in the second embodiment.

Moreover, in the present embodiment, the battery ECU 10 is provided with a single signal output port 10c instead of the plurality of signal output ports 10c1-10cN described in the second embodiment.

Furthermore, in the present embodiment, each of the voltage monitors 20 is further provided with a signal output port 20c.

Next, the configuration of the battery monitoring apparatus 53 according to the present embodiment will be described in detail.

The signal output port 10c of the battery ECU 10 is connected, via the signal line 35, with the signal input port 20b of the voltage monitor 20 corresponding to the battery block 62 having the lowest electric potential (i.e., a predetermined one of the voltage monitors 20).

In each of the voltage monitors 20, the slave unit 26 is connected, via the signal wiring γ, with the signal output port 20c. Moreover, the signal output port 20c is connected, via a corresponding one of the connection lines 36, with the signal input port 20b of another of the voltage monitors 20 which corresponds to the battery block 62 connected with and higher in electric potential than the battery block 62 corresponding to the voltage monitor 20. Consequently, all the voltage monitors 20 are connected in series with each other via the connection lines 36.

The connection lines 36 are formed of electrical conductor wires. In addition, the electric conductor wires forming the connection lines 36 may be of the same type as or a different type from the electric conductor wire of which the signal line 35 is formed.

In the present embodiment, the battery ECU 10 (more specifically, the MCU 13 of the battery ECU 10) and the voltage monitors 20 (more specifically, the slave units 26 of the voltage monitors 20) together constitute a monitor activation device that sequentially activates the voltage monitors 20 with time lags therebetween (i.e., respectively at different times).

Figure 7:
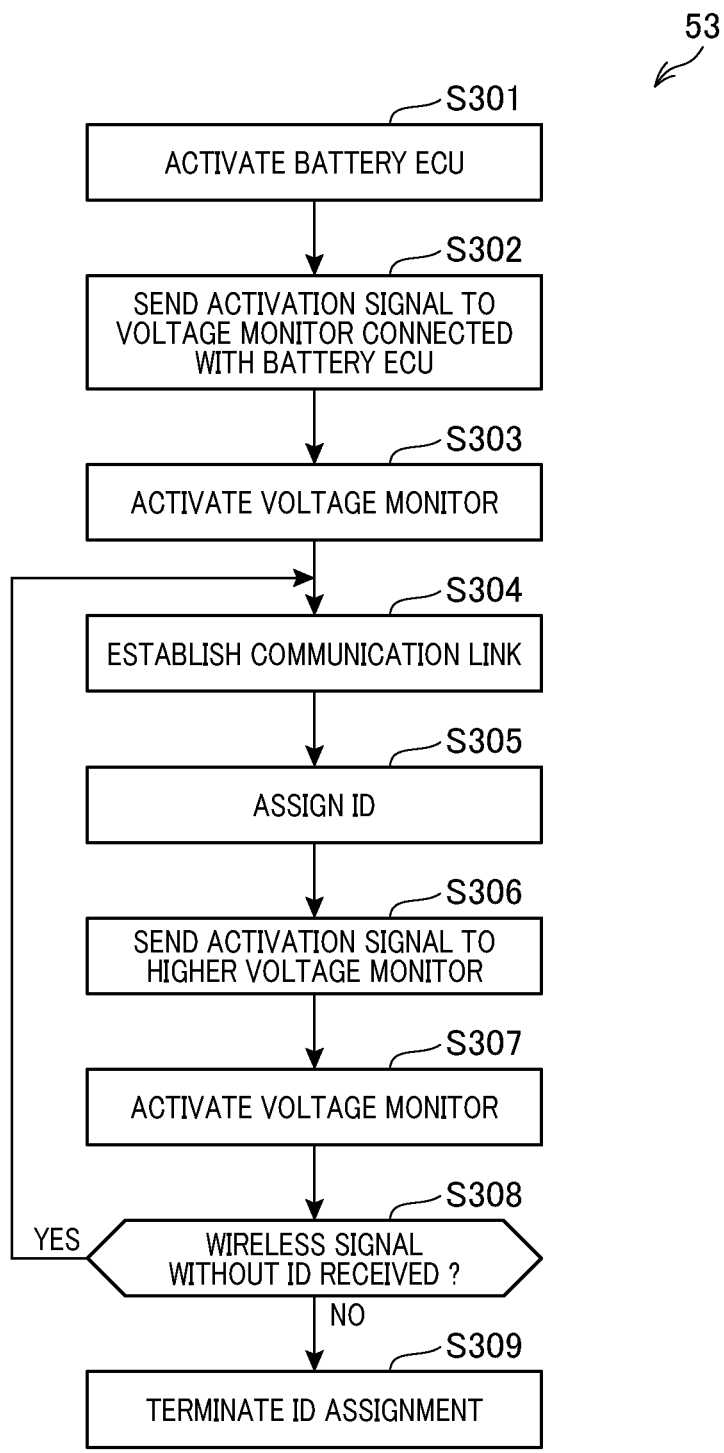
FIG. 7 is a flow chart illustrating a process of assigning IDs to voltage monitors in the battery monitoring apparatus according to the third embodiment.

Next, with reference to FIG. 7, explanation will be given of a process of assigning IDs to the voltage monitors 20 in the battery monitoring apparatus 53 according to the present embodiment.

In step S301, the battery ECU 10 is activated upon the power switch of the vehicle being turned on.

In step S302, the battery ECU 10 sends the activation signal, via the signal line 35, to the voltage monitor 20 that is connected with the battery ECU 10 via the signal line 35. Consequently, in step S303, the voltage monitor 20 corresponding to the battery block 62 having the lowest electric potential is activated.

In step S304, the slave unit 26 of the voltage monitor 20 wirelessly communicates with the master unit 16 of the battery ECU 10 to establish a communication link therebetween.

In step S305, the master unit 16 assigns, of the IDs having not been assigned yet, the lowest ID to the slave unit 26 that has just established the communication link with the master unit 16.

In step S306, if there is a voltage monitor 20 one-level higher than the voltage monitor 20 that includes the slave unit 26 to which an ID has just been assigned, then the slave unit 26 sends, via the corresponding connection line 36, the activation signal to the one-level higher voltage monitor 20. Consequently, in step S307, the one-level higher voltage monitor 20 is activated. Then, the slave unit 26 of the activated voltage monitor 20, to which no ID has been assigned yet, transmits a wireless signal to the master unit 16 of the battery ECU 10.

In step S308, the master unit 16 of the battery ECU 10 determines whether there is a wireless signal received from a slave unit 26 having no ID.

If the determination in step S308 results in a "YES" answer, i.e., if there is a wireless signal received by the master unit 16 from a slave unit 26 having no ID, the process returns to step S304 in which the master unit 16 wirelessly communicates with the slave unit 26 having no ID to establish a communication link therebetween. Thereafter, steps S305-S308 are repeated.

In contrast, if the determination in step S308 results in a "NO" answer, i.e., if there is no wireless signal received by the master unit 16 from a slave unit 26 having no ID, the process proceeds to step S309.

In step S309, the process of assigning IDs to the voltage monitors 20 is terminated.

More particularly, in the present embodiment, the sending of the activation signal, if there is a voltage monitor 20 one-level higher than the activated voltage monitor 20, to the one-level higher voltage monitor 20 is performed in step S306 by the slave unit 26 of the activated voltage monitor 20 by sending the activation signal to the signal output port 20c of the activated voltage monitor 20. Consequently, if there is a connection line 36 connected with the signal output port 20c of the activated voltage monitor 20, i.e., if there is a voltage monitor 20 one-level higher than the activated voltage monitor 20, the activation signal will be sent to the one-level higher voltage monitor 20. In contrast, if there is no connection line 36 connected with the signal output port 20c of the activated voltage monitor 20, i.e., if there is no voltage monitor 20 one-level higher than the activated voltage monitor 20, the activation signal will not be sent to any other voltage monitors 20.

As described above, in the ID assignment process according to the present embodiment, the slave unit 26 of the activated voltage monitor 20 wirelessly communicates with the master unit 16 of the battery ECU 10 to establish a communication link therebetween (steps S302-S304). Then, an ID is assigned to the slave unit 26 by the master unit 16 (step S305). Thereafter, the activation signal is sent from the activated voltage monitor 20 to the one-level higher voltage monitor 20 (step S306), thereby activating the one-level higher voltage monitor 20 (step S307).

According to the present embodiment, it is possible to achieve the same advantageous effects as described in the second embodiment.

Moreover, in the present embodiment, each adjacent pair of the voltage monitors 20 is connected via a corresponding one of the connection lines 36; therefore, the battery ECU 10 is only required to be connected with a predetermined one of the voltage monitors 20. Consequently, it becomes possible to simplify the wiring between the battery ECU 10 and the voltage monitors 20 in comparison with the case of connecting each of the voltage monitors 20 with the battery ECU 10 via a corresponding one of the signal lines 35 as in the second embodiment.

Furthermore, in the present embodiment, all the voltage monitors 20 are connected in series with each other via the connection lines 36; therefore, even with increase in the number of the voltage monitors 20, it is sufficient for the battery ECU 10 to include only one signal output port 10c to which the signal line 35 is connected. Consequently, it becomes possible to cope with increase in the number of the voltage monitors 20 without providing any additional signal output ports in the battery ECU 10.

Other Embodiments

The above-described embodiments may be modified as follows.

In the above-described embodiments, all the battery blocks 62 are connected in series with each other. Moreover, the predetermined order, in which the voltage monitors 20 are sequentially activated and IDs are sequentially assigned to the voltage monitors 20, is the order in which the electric potentials of the battery blocks 62 respectively corresponding to the voltage monitors 20 increase. As an alternative, the predetermined order may be the order in which the electric potentials of the battery blocks 62 respectively corresponding to the voltage monitors 20 decrease. As another alternative, all the battery blocks 62 may be connected in parallel with each other; the predetermined order may be the order from the voltage monitor 20 corresponding to the battery block 62 arranged at one end of the parallel connection to the voltage monitor 20 corresponding to the battery block 62 arranged at the other end of the parallel connection.

In the first embodiment, the battery ECU 10 may alternatively be configured so that: electric power is directly supplied from the electric power feeding unit 11 to the electric power output ports 10b1-10bN; and the MCU 13 controls the on/off state of the electric power supply (in other words, selectively permits and interrupts the electric power supply).

In the above-described embodiments, the monitor activation function of the MCU 13 of the battery ECU 10 may alternatively be performed by a device provided outside the battery ECU 10.

In the second and third embodiments, the electric power feeding units 21 of the voltage monitors 20 may alternatively be supplied with electric power from an electric power source other than the unit batteries 63 of the corresponding battery blocks 62, such as the auxiliary battery 67.

While the present disclosure has been described pursuant to the exemplary embodiments, it should be appreciated that the present disclosure is not limited to the exemplary embodiments. Instead, the present disclosure encompasses various modifications and changes within equivalent ranges. In addition, various combinations and modes are also included in the category and the scope of technical idea of the present disclosure.

What is claimed is:

1. A battery monitoring apparatus for monitoring a plurality of unit batteries of an assembled battery installed in a vehicle, the unit batteries of the assembled battery being grouped into a plurality of battery blocks, the battery monitoring apparatus comprising:
a battery ECU;
a plurality of voltage monitors each of which is adapted to be mounted to a corresponding one of the battery blocks; and
a monitor activation device,
wherein
the battery ECU is configured to wirelessly transmit commands to the voltage monitors,
the voltage monitors are configured to detect voltage information of the unit batteries and wirelessly transmit the detected voltage information to the battery ECU, and
the monitor activation device is configured to sequentially activate the voltage monitors with time lags therebetween in a predetermined order recognized by the battery ECU,
wherein
the battery monitoring apparatus is configured so that:
the voltage monitors sequentially start wireless communication with the battery ECU in the predetermined order in which the voltage monitors are sequentially activated by the monitor activation device; and
the battery ECU assigns IDs, via the wireless communication, sequentially to the voltage monitors in the predetermined order.

2. The battery monitoring apparatus as set forth in claim 1, wherein all the battery blocks are connected in series with each other, and
the predetermined order, in which the voltage monitors are sequentially activated by the monitor activation device, is an order in which electric potentials of the battery blocks respectively corresponding to the voltage monitors decrease or an order in which the electric potentials of the battery blocks respectively corresponding to the voltage monitors increase.

3. The battery monitoring apparatus as set forth in claim 1, wherein the voltage monitors are further configured to be sequentially activated in the predetermined order in response to electric power sequentially supplied to the voltage monitors in the predetermined order or signals sequentially transmitted to the voltage monitors in the predetermined order.

4. The battery monitoring apparatus as set forth in claim 3, wherein the monitor activation device comprises the battery ECU, and
each of the voltage monitors is connected with the battery ECU via predetermined wiring.

5. The battery monitoring apparatus as set forth in claim 1, wherein the monitor activation device comprises the battery ECU,
each of the voltage monitors is connected with the battery ECU via a corresponding one of a plurality of electric power lines,
each of the voltage monitors is configured to be supplied with electric power from the battery ECU via the corresponding electric power line and thereby activated, and
the battery ECU is configured to sequentially start the supply of electric power to the voltage monitors in the predetermined order and thereby sequentially activate the voltage monitors in the predetermined order.

6. The battery monitoring apparatus as set forth in claim 1, wherein the monitor activation device comprises the battery ECU,
each of the voltage monitors is configured to be activated, upon receipt of a predetermined activation signal, using electric power supplied from an electric power source other than the battery ECU,
each of the voltage monitors is connected with the battery ECU via a corresponding one of a plurality of signal lines that transmit the activation signal, but neither the commands nor the voltage information, and
the battery ECU is configured to send the activation signal, via the corresponding signal lines, sequentially to the voltage monitors in the predetermined order and thereby sequentially activate the voltage monitors in the predetermined order.

7. The battery monitoring apparatus as set forth in claim 6, wherein for each of the voltage monitors, the electric power source other than the battery ECU is the unit batteries of the battery block corresponding to the voltage monitor.

8. The battery monitoring apparatus as set forth in claim 1, wherein the monitor activation device comprises the battery ECU and the voltage monitors,
each of the voltage monitors is configured to be activated, upon receipt of a predetermined activation signal, using electric power supplied from an electric power source other than the battery ECU,
the battery ECU is connected with a predetermined one of the voltage monitors via a signal line that transmits the activation signal, but neither the commands nor the voltage information,
all the voltage monitors are connected, via a plurality of connection lines that transmit the activation signal, in series with each other in the predetermined order from the predetermined voltage monitor, and
the battery monitoring apparatus is configured so that:
the battery ECU sends the activation signal to the predetermined voltage monitor via the signal line and thereby activates the predetermined voltage monitor; and then
the remaining voltage monitors are sequentially activated in the predetermined order through successive transmission of the activation signal from each activated one of the voltage monitors to another of the voltage monitors which is connected with the activated voltage monitor via a corresponding one of the connection lines and has not been activated yet.

9. The battery monitoring apparatus as set forth in claim 8, wherein for each of the voltage monitors, the electric power source other than the battery ECU is the unit batteries of the battery block corresponding to the voltage monitor.

10. A battery monitoring apparatus for monitoring a plurality of unit batteries of an assembled battery installed in a vehicle, the unit batteries of the assembled battery being grouped into a plurality of battery blocks,
the battery monitoring apparatus comprising:
a battery ECU;

a plurality of voltage monitors each of which is adapted to be mounted to a corresponding one of the battery blocks; and a monitor activation device, wherein the battery ECU is configured to wirelessly transmit commands to the voltage monitors, the voltage monitors are configured to detect voltage information of the unit batteries and wirelessly transmit the detected voltage information to the battery ECU, and the monitor activation device is configured to sequentially activate the voltage monitors with time lags therebetween in a predetermined order recognized by the battery ECU, wherein the voltage monitors are further configured to be sequentially activated in the predetermined order in response to electric power sequentially supplied to the voltage monitors in the predetermined order or signals sequentially transmitted to the voltage monitors in the predetermined order.

11. The battery monitoring apparatus as set forth in claim 10, wherein the monitor activation device comprises the battery ECU, and each of the voltage monitors is connected with the battery ECU via predetermined wiring.

12. The battery monitoring apparatus as set forth in claim 11, wherein the predetermined wiring comprises a plurality of electric power lines, each of the voltage monitors is connected with the battery ECU via a corresponding one of the electric power lines, each of the voltage monitors is configured to be supplied with electric power from the battery ECU via the corresponding electric power line and thereby activated, and the battery ECU is configured to sequentially start the supply of electric power to the voltage monitors in the predetermined order and thereby sequentially activate the voltage monitors in the predetermined order.

13. The battery monitoring apparatus as set forth in claim 11, wherein each of the voltage monitors is configured to be activated, upon receipt of a predetermined activation signal, using electric power supplied from an electric power source other than the battery ECU, the predetermined wiring comprises a plurality of signal lines that transmit the activation signal, but neither the commands nor the voltage information, each of the voltage monitors is connected with the battery ECU via a corresponding one of the signal lines, and the battery ECU is configured to send the activation signal, via the corresponding signal lines, sequentially to the voltage monitors in the predetermined order and thereby sequentially activate the voltage monitors in the predetermined order.

14. The battery monitoring apparatus as set forth in claim 13, wherein for each of the voltage monitors, the electric power source other than the battery ECU is the unit batteries of the battery block corresponding to the voltage monitor.

15. The battery monitoring apparatus as set forth in claim 11, wherein the monitor activation device further comprises the voltage monitors, each of the voltage monitors is configured to be activated, upon receipt of a predetermined activation signal, using electric power supplied from an electric power source other than the battery ECU, the predetermined wiring comprises a signal line that transmits the activation signal, but neither the commands nor the voltage information, and a plurality of connection lines that transmit the activation signal, the battery ECU is connected with a predetermined one of the voltage monitors via the signal line, all the voltage monitors are connected, via the connection lines, in series with each other in the predetermined order from the predetermined voltage monitor, and the battery monitoring apparatus is configured so that:

the battery ECU sends the activation signal to the predetermined voltage monitor via the signal line and thereby activates the predetermined voltage monitor; and then the remaining voltage monitors are sequentially activated in the predetermined order through successive transmission of the activation signal from each activated one of the voltage monitors to another of the voltage monitors which is connected with the activated voltage monitor via a corresponding one of the connection lines and has not been activated yet.

16. The battery monitoring apparatus as set forth in claim 15, wherein for each of the voltage monitors, the electric power source other than the battery ECU is the unit batteries of the battery block corresponding to the voltage monitor.

* * * * *